United States Patent [19]
Saito

[11] Patent Number: 5,559,734
[45] Date of Patent: Sep. 24, 1996

[54] MULTIPLE VOLTAGE MEMORY

[76] Inventor: Tamio Saito, 100 Century Centre Ct. Ste. 503, San Jose, Calif. 95112-4512

[21] Appl. No.: 427,570

[22] Filed: Apr. 24, 1995

[51] Int. Cl.$^6$ ................................................. G11C 11/56
[52] U.S. Cl. ............................................ 365/168; 365/149
[58] Field of Search .................................. 369/168, 149, 369/184

[56] References Cited

U.S. PATENT DOCUMENTS

| | | | |
|---|---|---|---|
| 4,156,286 | 5/1979 | Connors | 369/182 |
| 4,661,929 | 4/1987 | Aoki et al. | 365/149 |
| 5,043,940 | 8/1991 | Harari | 369/168 |
| 5,184,324 | 2/1993 | Ohta | 365/149 |
| 5,424,978 | 6/1995 | Wada | 365/168 |

FOREIGN PATENT DOCUMENTS

| | | |
|---|---|---|
| 60-239994 | 11/1985 | Japan . |
| 62-2650 | 1/1987 | Japan . |
| 63-195896 | 8/1988 | Japan . |
| 63-195897 | 8/1988 | Japan . |
| 1-192083 | 8/1989 | Japan . |

*Primary Examiner*—A. Zarabian
*Attorney, Agent, or Firm*—Edward B. Weller

[57] ABSTRACT

A memory has a plurality of memory cells that each store a voltage signal indicative of a multiple bit signal. Each logic value of the multiple bit signal has a unique voltage range. The voltage ranges are unequal and are selected so that the decay of the voltage of the voltage signal in the range remains in the range for each level at a predetermined time. This memory provides logic levels so that the decay time of the voltage signal is greater for larger voltages of the voltage signal. The decay time in each logic level is almost equal. A voltage generator provides the voltage signal to the memory cells responsive to a multiple bit digital data signal. The voltage generator may include a digital-to-analog converter that provides the voltage signal and has at least one more bit than the multiple bit digital data signal. A memory stores a lookup table and provides another multiple bit data signal to the digital-to-analog converter responsive to the multiple bit digital data signal. Alternatively, the digital-to-analog converter may have resistors of different resistances to generate the voltage signal nonlinearly relative to the multiple bit digital data signal. Alternatively, the digital-to-analog converter has a nonlinear device, such as a diode, to generate the voltage signal nonlinearly relative to the multiple bit digital data signal.

20 Claims, 11 Drawing Sheets

DECAY OF EACH LOGIC LEVEL (PRIOR ART)

FIG. 6

| LOGIC LEVEL 600 | 4 BIT SIGNAL 602 | VOLTAGE RANGE 604 |
|---|---|---|
| 0 | 0000 | 0.033826 |
| 1 | 0001 | 0.101594 |
| 2 | 0010 | 0.203533 |
| 3 | 0011 | 0.339994 |
| 4 | 0100 | 0.511452 |
| 5 | 0101 | 0.718510 |
| 6 | 0110 | 0.961916 |
| 7 | 0111 | 1.242563 |
| 8 | 1000 | 1.561512 |
| 9 | 1001 | 1.920004 |
| 10 | 1010 | 2.319482 |
| 11 | 1011 | 2.761617 |
| 12 | 1100 | 3.248338 |
| 13 | 1101 | 3.781868 |
| 14 | 1110 | 4.364772 |
| 15 | 1111 | 5.000013 |

FIG. 12

| LOGIC LEVEL 1200 | 4 BIT SIGNAL 1202 | 7 BIT SIGNAL 1204 |
| --- | --- | --- |
| 0 | 0000 | 0000000 |
| 1 | 0001 | 0000010 |
| 2 | 0010 | 0000101 |
| 3 | 0011 | 0001000 |
| 4 | 0100 | 0001101 |
| 5 | 0101 | 0010100 |
| 6 | 0110 | 0011000 |
| 7 | 0111 | 0011111 |
| 8 | 1000 | 0100111 |
| 9 | 1001 | 0110001 |
| 10 | 1010 | 0111011 |
| 11 | 1011 | 1000110 |
| 12 | 1100 | 1010011 |
| 13 | 1101 | 1100000 |
| 14 | 1110 | 1110101 |
| 15 | 1111 | 1111111 |

MULTIPLE VOLTAGE MEMORY

FIELD OF THE INVENTION

This invention relates to memory cells, and more particularly to memory cells having multiple voltage levels.

BACKGROUND OF THE INVENTION

Conventional random access memories store only one bit of information per unit memory cell. For static random access memory (SRAM), a flip-flop gate comprising a pair of transistors stores the bit of information. For dynamic random access memory (DRAM), a capacitor in the memory cell stores a charge that is indicative of the bit of information.

The bit of information is typically stored in the unit memory cell by selecting and assigning two voltage levels each corresponding to either a logic "1" or a logic "0". For SRAMs, the flip-flop gate stores a logic "1" as the condition of one transistor being on and the other transistor being off and stores a logic "0" as the condition of the transistors being reversed.

For DRAMs, the capacitor stores the charge in a first voltage range (typically a higher voltage range), such as 3–5 volts, to indicate a logic "1" and in a second voltage range (typically a lower voltage range), such as 0–2 volts, to indicate a logic "0".

As disclosed in the U.S. Patent application Ser. No. 08/136,161 filed Oct. 15, 1993, the subject matter of which is incorporated herein by reference, a single DRAM memory cell stores multiple bit logic signals by dividing a voltage range into discrete voltage levels. For example, a memory cell may store four bits by dividing a 4 volt range into sixteen 0.25 volt ranges: bits 0000 are stored as a voltage between 0 and 0.25 volts; bits 0001 are stored as a voltage between 0.25 and 0.5 volts; and so forth bits 1111 are stored as a voltage between 3.75 and 4.0 volts. In general, the width of the voltage level equals the voltage range divided by 2 to the power of the number of bits.

The decay time for the capacitors in the memory cells is not uniform at different voltage levels. Hence, the refresh time of the memory cell is not equal for different logic levels. In a memory system using such memory cells, the refresh time of the system is selected based on the logic level having the fastest decay time. Thus, this refresh time limits the performance of the system.

SUMMARY OF THE INVENTION

In accordance with the present invention, a memory has a plurality of memory cells that each store a voltage signal indicative of a multiple bit signal. Each logic value of the multiple bit signal has a unique voltage range. The voltage ranges are unequal and are selected so that the decay of the voltage of the voltage signal in the range remains in the range for each level at a predetermined time.

A voltage generator provides the voltage signal to the memory cells responsive to a multiple bit digital data signal. In one embodiment, the voltage generator includes a digital-to-analog converter that provides the voltage signal and has at least one more bit than the multiple bit digital data signal. In another embodiment, a memory stores a lookup table and providing another multiple bit data signal to the digital-to-analog converter responsive to the multiple bit digital data signal. In one embodiment, the digital-to-analog converter has resistors of different resistance to generate the voltage signal nonlinearly relative to the multiple bit digital data signal. In another embodiment, the digital-to-analog converter has a nonlinear device, such as a diode, to generate the voltage signal nonlinearly relative to the multiple bit digital data signal.

This system provides logic levels so that the decay time of the voltage signal is greater for larger voltages of the voltage signal. The decay time in each logic level that is almost equal.

BRIEF DESCRIPTION OF THE DRAWINGS

FIG. 6 is a diagram illustrating the voltage levels for the nonuniform multiple logic levels of the memory cell of FIG. 2.

FIG. 12 is a a diagram illustrating the logic level bit conversions for the higher order bit digital-to-analog converter of FIG. 11.

DESCRIPTION OF THE PREFERRED EMBODIMENT

Figure 1:
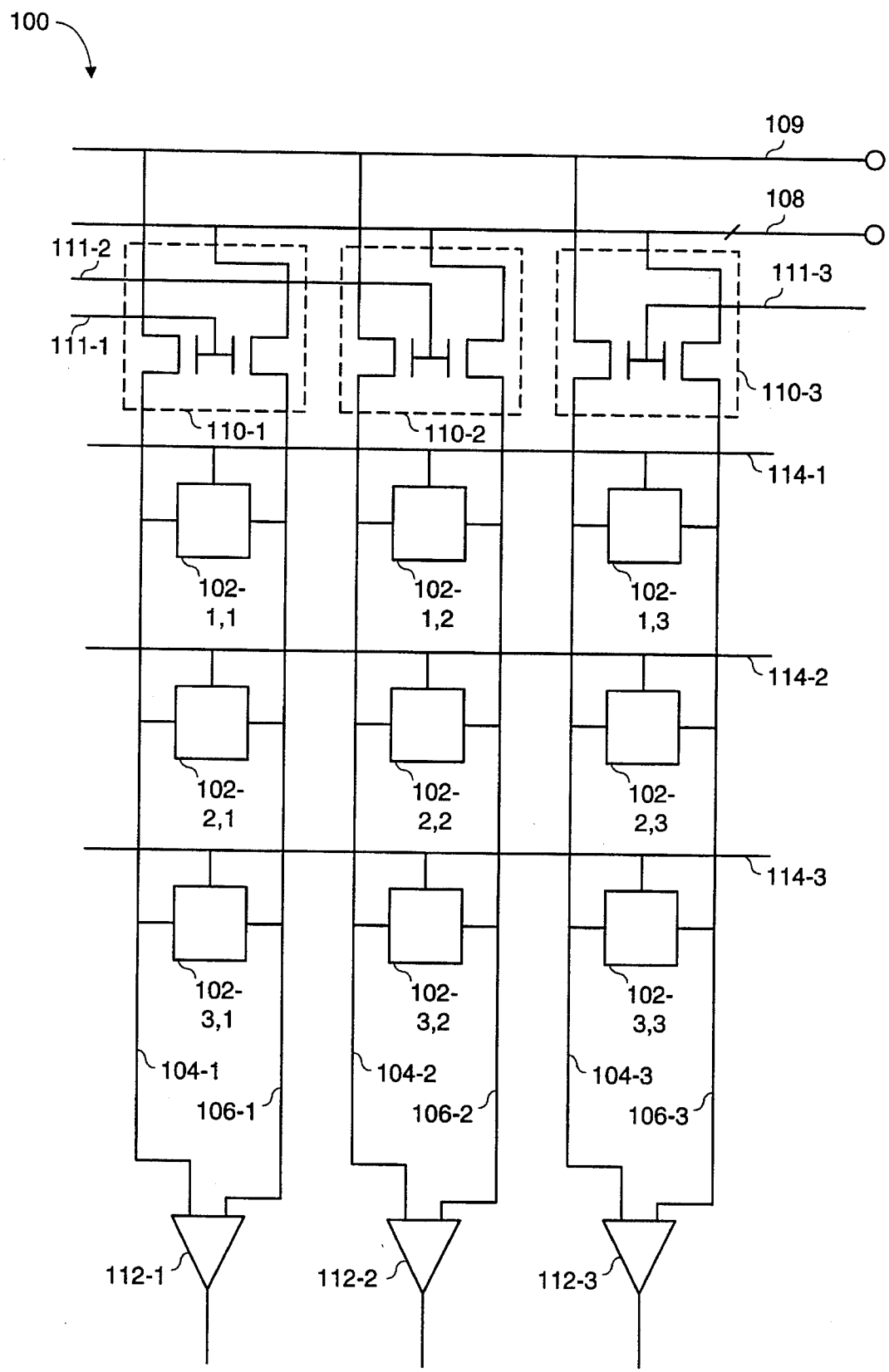
FIG. 1 is a block diagram illustrating a memory circuit in accordance with the present invention.

Referring to FIG. 1, there is shown a block diagram illustrating a memory circuit 100 in accordance with the present invention. The memory circuit 100 comprises a plurality of memory cells 102 arranged in an array of m rows and n columns. For simplicity and clarity, only 9 memory cells 102 are shown. The reference numbers of the memory cells 102 are 102-$i,j$ for the memory cell in row i and column j.

For each column j, a pair of bit lines 104-$j$ and 106-$j$ couples memory cells 102 in the column for communicating voltage levels from signal lines 109 and 108 supplied through a corresponding driver 110-$j$ to one end of the bit lines 104-$j$ and 106-$j$, respectively, for storage in the memory cells 102 and for communicating a voltage level stored in a memory cell 102 in the column to a sense amplifier 112 at the other end of the bit lines 104 and 106. The signal line 109 may be, for example, coupled to ground. The sense amplifier 112 provides a buffered voltage signal on a line 113. Each driver 110-$j$ is enabled by an enable signal applied to a corresponding bit-driver enable line 111-j. For each row i, a word line 114 couples memory cells 102 in the row for communicating a selection signal to the memory cells 102 in the row to enable reading from or writing to the memory cell 102.

The bit lines 104 and 106 have three functions. First, the bit lines 104 and 106 select a specific row of the memory cells 102 by driving the bit-line driver 110 for the row. Second, the bit lines 104 and 106 apply a signal to a selected row by enabling and driving the bit-line driver 110 corresponding to the selected row. Third, the bit lines 104 and 106 enable the sense amplifier 112 for a selected row for reading the logic voltage level stored in a memory cell 102 in the selected row.

Figure 2:
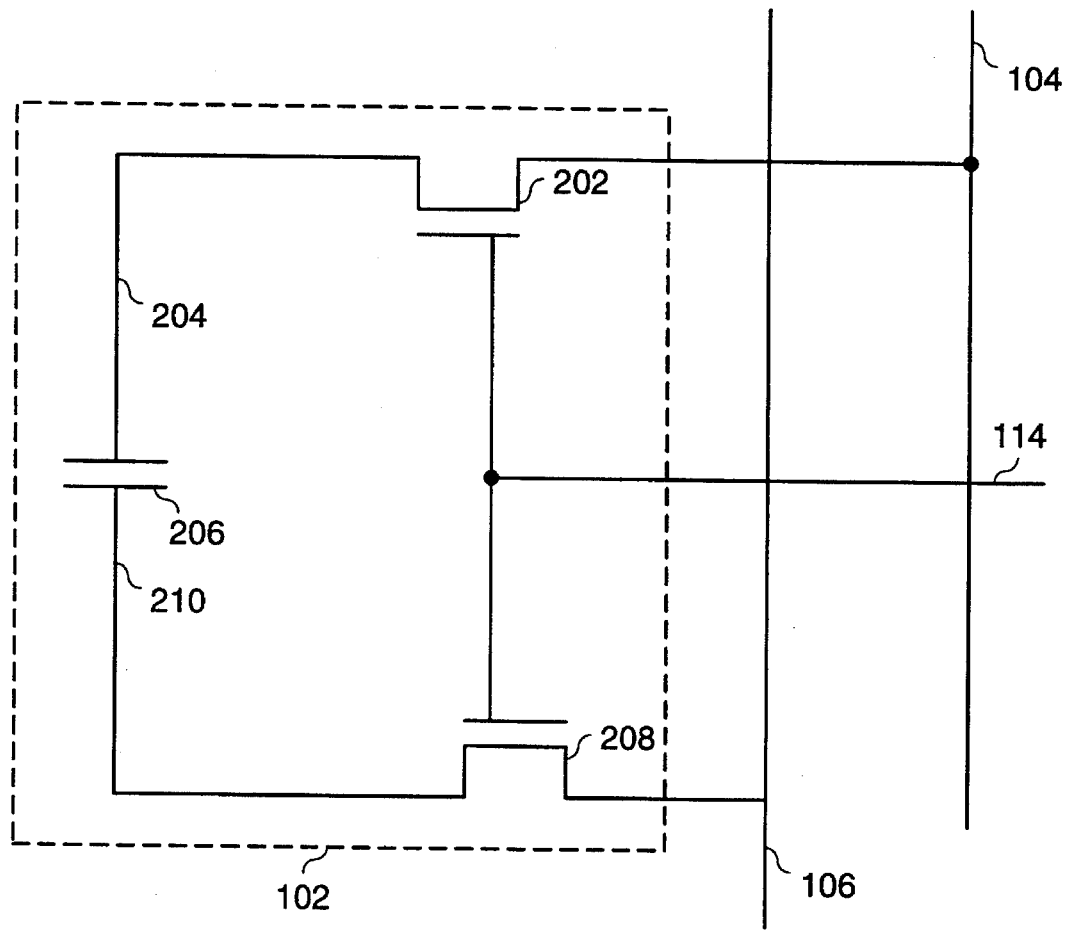
FIG. 2 is a block diagram illustrating a first embodiment of a memory cell of the memory of FIG. 1.

Referring to FIG. 2, there is a block diagram illustrating a memory cell 102 of the memory 100. A first transfer gate 202 controls the conductivity between a first terminal 204 of a storage capacitor 206 and the bit-line 104. A second transfer gate 208 controls the conductivity between a second terminal 210 of the storage capacitor 206 and the bit-line 106. The storage capacitor 206 stores a charge to generate a multi-level voltage therein indicative of the logic level of the stored information. The transfer gates 202 and 208 are enabled by an enabling signal applied to the word line 114. The transfer gates 202, 208 may be, for example, field effect transistors (FETs).

Figure 3:
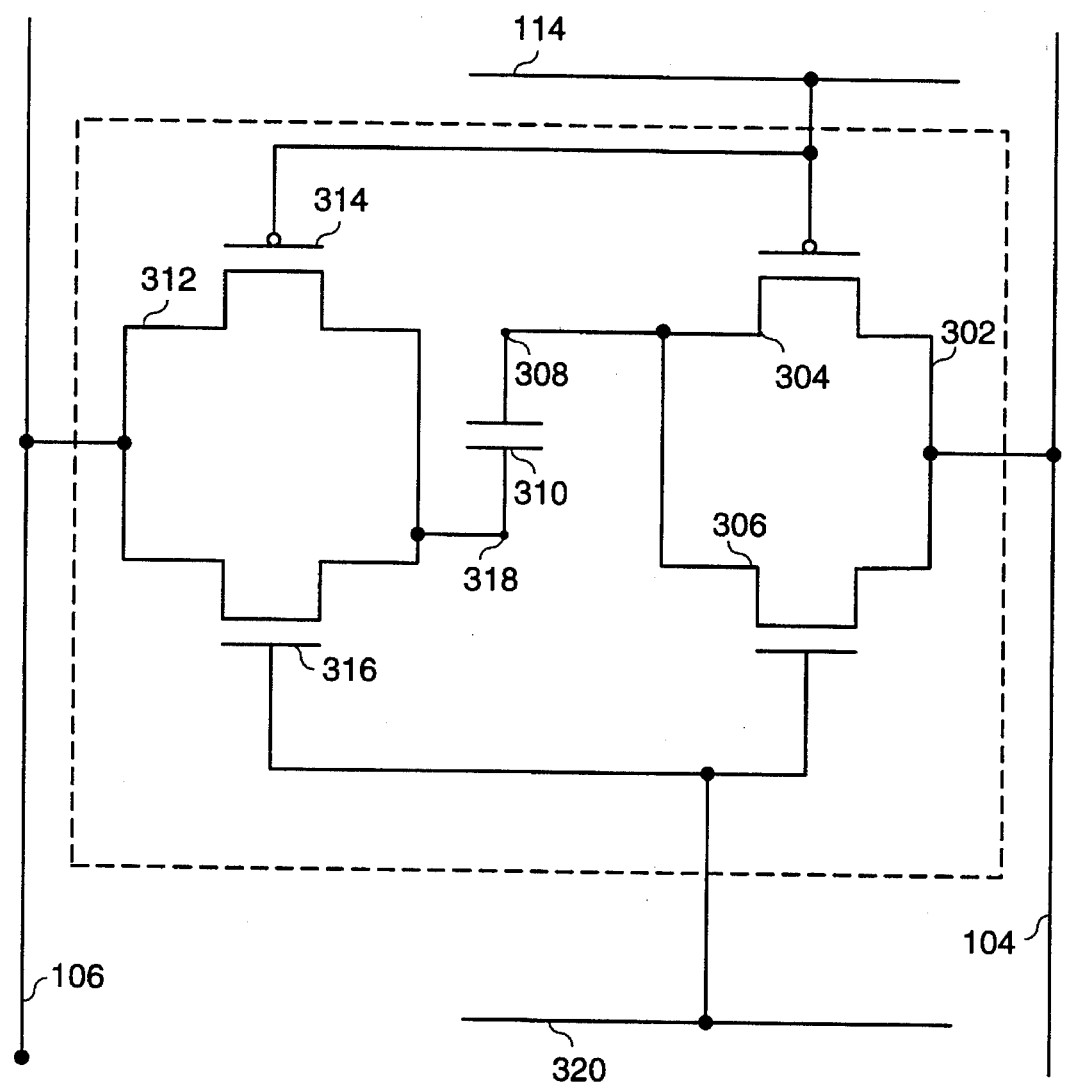
FIG. 3 is a block diagram illustrating a second embodiment of a memory cell of the memory of FIG. 1.

Referring to FIG. 3, there is shown a block diagram illustrating a second embodiment of a memory cell 102. A complementary transfer gate 302 comprising complementary transistors 304 and 306, controls the conductivity between a first terminal 308 of a storage capacitor 310 and the bit-line 104. A second complementary transfer gate 312 comprising complementary transistors 314 and 316, controls the conductivity between a second terminal 318 of the storage capacitor 310 and the bit-line 106. The complementary transistor pairs 304 and 308, 314 and 316 each may be, for example, a p-channel and an n-channel enhancement MOS FET pair. The complementary transfer gates 302 and 312 are enabled by an enabling signal applied to a respective word line 114 and 320.

For clarity the invention is now described in terms of the memory cell 102 of FIG. 2. However, the invention also applies to the memory cell 102 of FIG. 3.

Figure 4:
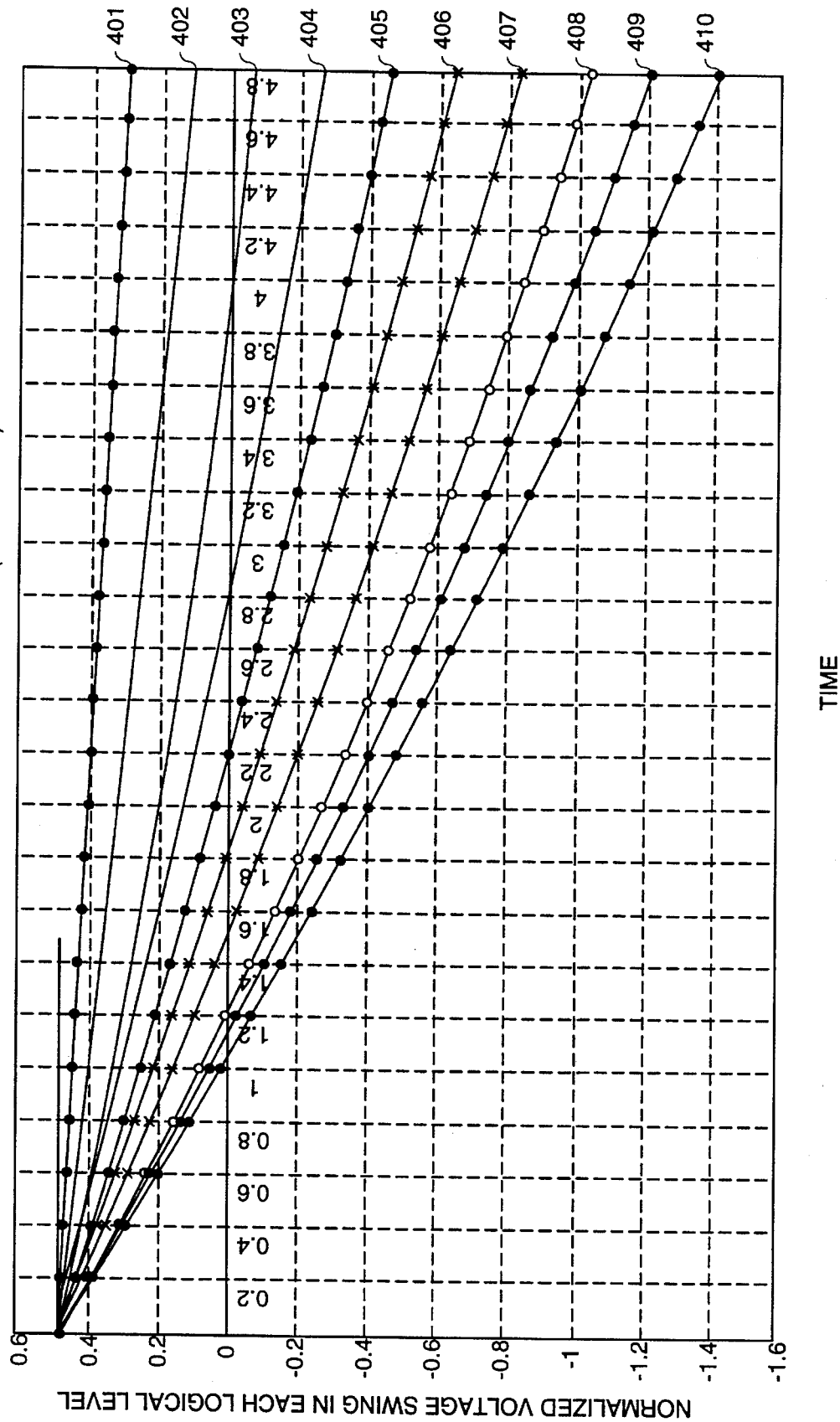
FIG. 4 is a graph of the decay time of a charge stored in a storage capacitor of FIG. 2 for a uniform logic level memory.

Referring to FIG. 4, there is shown a graph of the decay time of the voltage stored in the storage capacitor 206 for a uniform logic level memory. In particular, the decay time is shown for logic levels of 0.5 volts each over a 0 to 5 volt range. Lines 401–410 are the decay time for the voltage ranges 0–0.5 volts, 0.5–1 volts, 1–1.5 volts, 1.5–2 volts, 2–2.5 volts, 2.5–3 volts, 3–3.5 volts, 3.5–4 volts, 4–4.5 volts, and 4.5–5 volts, respectively. The decay time is normalized to the voltage swing in the logic level. Thus, it can be seen that the 20% voltage decay time of the highest voltage level (4.5–5 volts) is less than one tenth that of the lowest voltage level (0–0.5 volts).

The voltage (V) of each cell 102 decays exponentially over time (t) according to the equation:

$$V = V_0 e^{\frac{t}{\tau}} \tag{1}$$

where $V_0$ is the initial voltage of the cell 102 at time equal to zero and $\tau$ is the time constant of the memory cell 102 given by $$\tau = R*C \tag{2}$$

where C is the capacitance of the storage capacitor 206 and a stray capacitor (not shown) and R is the resistivity of both the storage capacitor 206 and the stray capacitor to ground.

Although the decay equation (1) is the same for each logic level, the time for the voltage to become a predetermined voltage relative to the logic level, for example one half of the logic level, differs for each logic level. The time (T) for the voltage to become one half of the logic level is $$T = -\tau \ln\left(\frac{Vo - \frac{1}{2} Vl}{Vo}\right) \tag{3}$$

where Vl is the spacing of the logic level.

Figure 5:
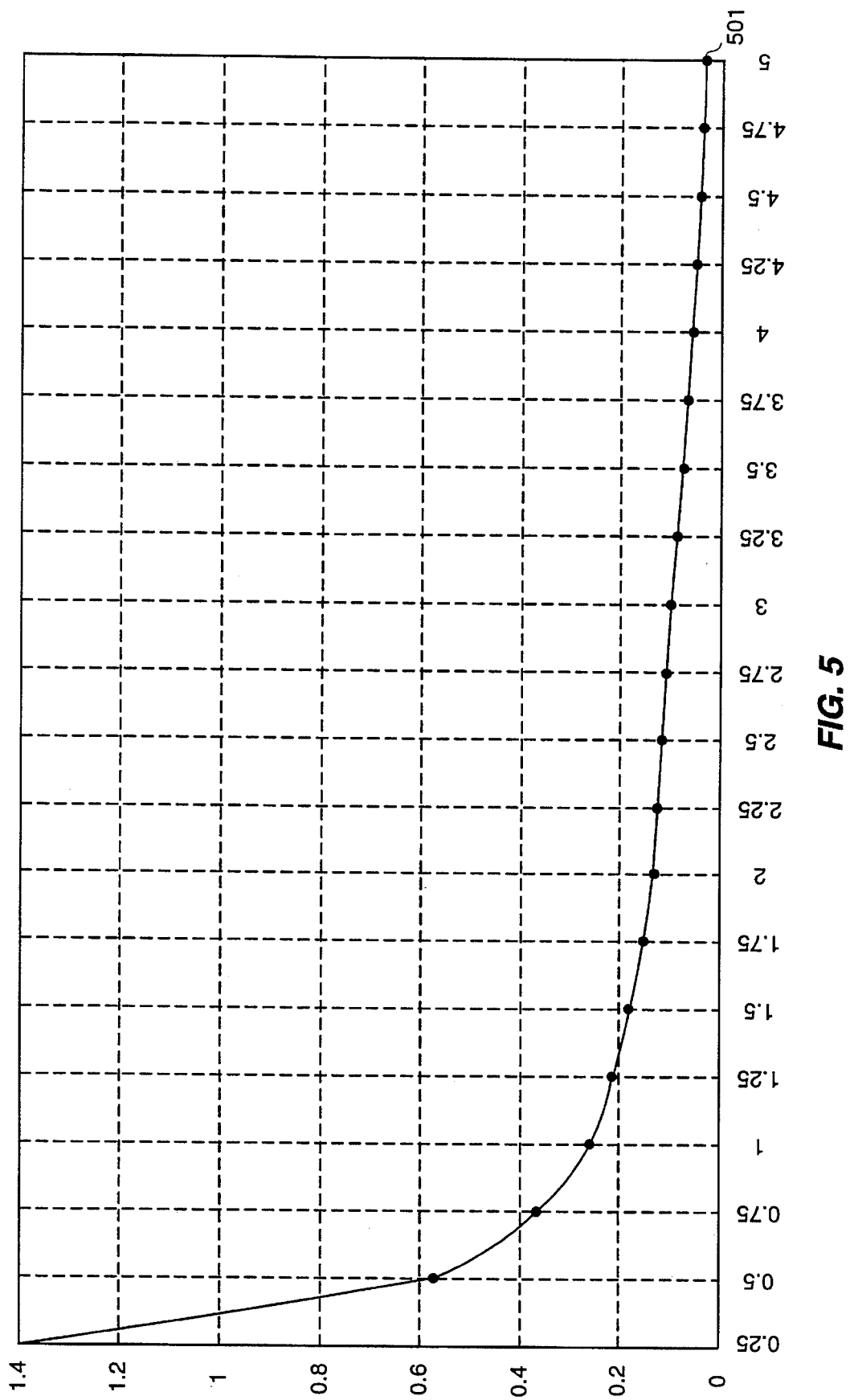
FIG. 5 is a graph of the 50% decay time of the charge stored in the storage capacitor for each logic level in a uniform logic level memory.

Referring to FIG. 5, there is shown a graph of a line 501 of the 50% decay time of the charge stored in the storage capacitor 206 for each logic level in a uniform logic level memory. The dependency on time is nearly exponential for voltages greater than approximately $(1/e)*V_{max}$, where e is the base of natural logarithms ($\approx 2.71828\ldots$) and $V_{max}$ is the maximum voltage of the range, in the example 5 volts.

Because of the charge decay characteristics of DRAMs, the voltage in the memory cells 102 is periodically refreshed. The minimum refresh cycle of the memory cells 102 is limited by the fastest decay time for a logic level, which occurs for the highest logic level decay. Here, the 5 volt logic level has the fastest decay time.

Referring to FIG. 6, there is shown a diagram illustrating the voltage levels for the nonuniform logic levels of the memory cell 102. The voltage levels for the logic levels are selected to make the time that the voltage becomes half of the logic level (T) equal for each logic level. In other words, the selection of T is made that maximizes the minimum T for the logic levels.

The logic levels may be selected by setting the half decay time of each logic level to be equal or in general $$\frac{Vo - 0.5 * Vl_{n-1}}{Vo} = \frac{Vi - 0.5 * Vl_i}{Vi} \bigg|_{i=0}^{i=n-1} \tag{4}$$

and $$Vi = \sum_{j=0}^{i} Vl_j, Vo = Vi/i = n \tag{5}$$

For example, for an initial voltage $V_0$=5 volts and a logic level voltage $V_1$=0.25 volts, the time T for 0.25 volts equals the time for 5 volts or $$T(0.25 \text{ volts})=T(5 \text{ volts}) \tag{6}$$

and from equation (3)

$$\ln\left(\frac{5 - Vl_{0.25V}}{5}\right) = \ln\left(\frac{0.25 - Vl_{5V}}{0.25}\right). \tag{7}$$

For these times to be equal, the logic level at these voltages must be different.

For example, the solution of equation (7) for a logic level for 5 volts yields $$Vl_{5V}=40*Vl_{0.25V} \tag{8}$$

Therefore, in general, the decay time of worst case logic level is maximized.

One example of such compensation is shown in FIG. 6. In FIG. 6, for the voltage levels which are higher than $V_{max}(5V)/e$, compensation is taken place in such a way that each voltage swing level $Vl_i$ is designed to be in proportion to $$\ln\left(\frac{V_i - 0.5Vl_i}{Vi}\right) \quad (9)$$

For the voltage levels which are smaller than $V_{max}(5V)/e$, the voltage levels of the logic levels are equal. Therefore, the minimum time T is an improvement of 5 times. In this manner decay time is manageable to be in the certain range. Therefore refresh time should not be limited by the minimum decay logic level.

The minimum logic level swing may be limited by other factors, such as noise and the offset voltage of the sense amplifiers 112. In this case, the minimum voltage is not determined by equations (4) or (6). Further, if the voltage generator (which generates the voltage to be written to the storage capacitor) is a digital-to-analog converter, a precise voltage adjustment is often difficult. Even in this case, if the minimum decay time is widened by increasing the logic swing level of higher logic levels, the minimum decay time can be controlled to be longer than that of equal logic swing level memories.

FIG. 6 shows an example for a 16 logic level system having a 5 volt range. The logic levels 600 are related to a corresponding 4 bit signal 602. The upper limit of the voltage ranges 604 for the logic levels 600 are determined using equations (4) and (5) modified by the noise and offset voltage limitations described earlier herein.

Figure 7:
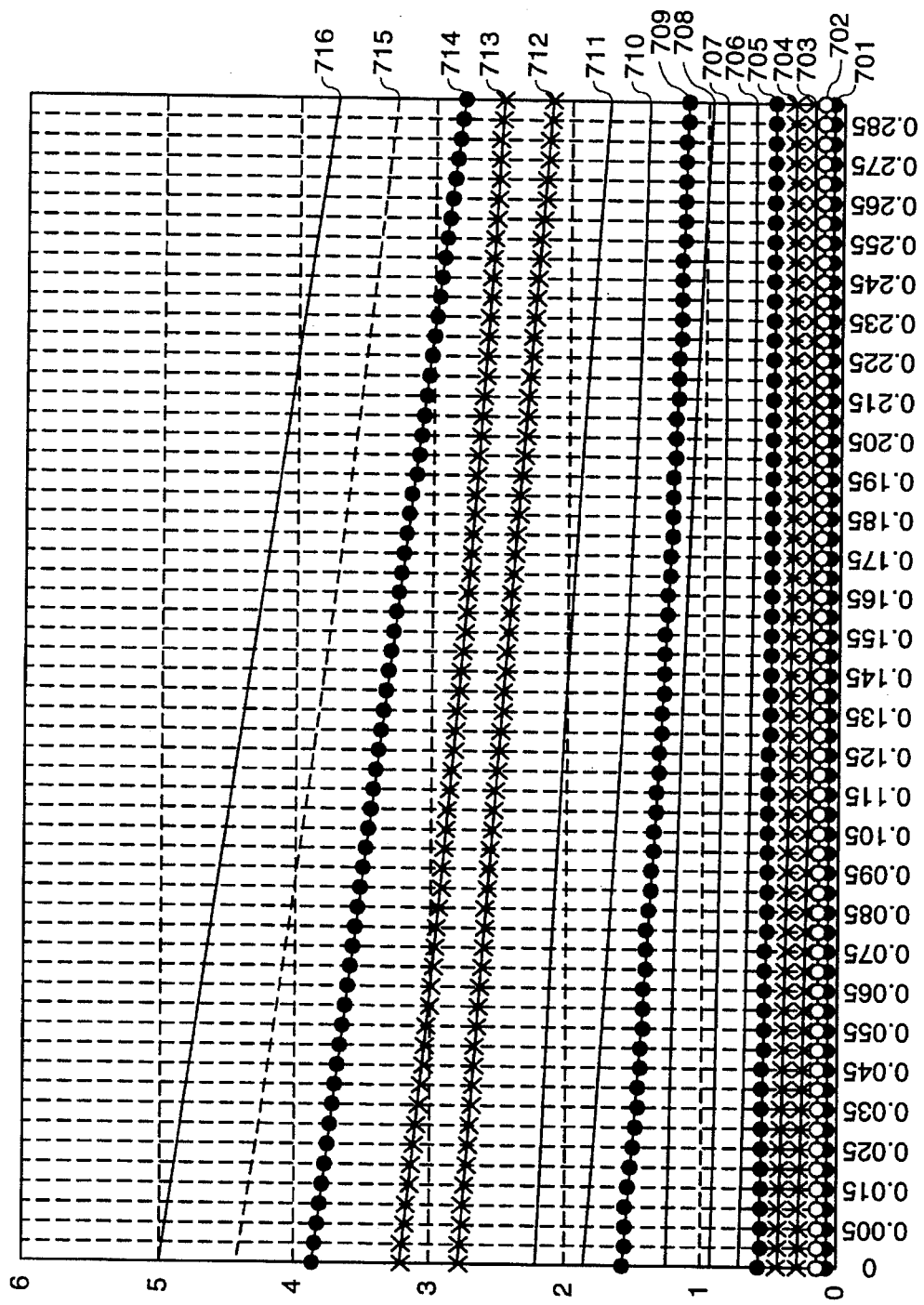
FIG. 7 is a graph illustrating the time dependence of the voltage levels for the nonuniform multiple logic levels of the memory cell of FIG. 6.

Referring to FIG. 7, there is shown a graph illustrating the time dependence of the voltage levels for nonuniform multiple logic levels of the memory cell 102. For illustration, the voltage range of 0 to 5 volts is divided into 16 logic levels corresponding to a 4 bit memory cell. Lines 701 through 716 show the decay of the voltage of the voltage signal over time for logic levels 602 having the value 0 through 15, respectively. The minimum logic voltage for the lowest logic level is 0.038 volts and the maximum logic voltage level is 0.635 volts. For a time constant of decay of 1, the time until each logic level is 0.075 seconds. The logic voltage differs by a factor of 20.

In another embodiment, this difference may be reduced by terminating the storage capacitor 206 at the half of voltage swing. For a voltage swing of 5 volts, the storage capacitor 206 may be terminated at 2.5 volts instead of 0 volts. With this terminating voltage, the voltage of the minimum logic level becomes 66.8 mV and the voltage of the maximum logic level becomes 575 mV. Here, the maximum and minimum voltage differ by a factor of 8.6.

Figure 8:
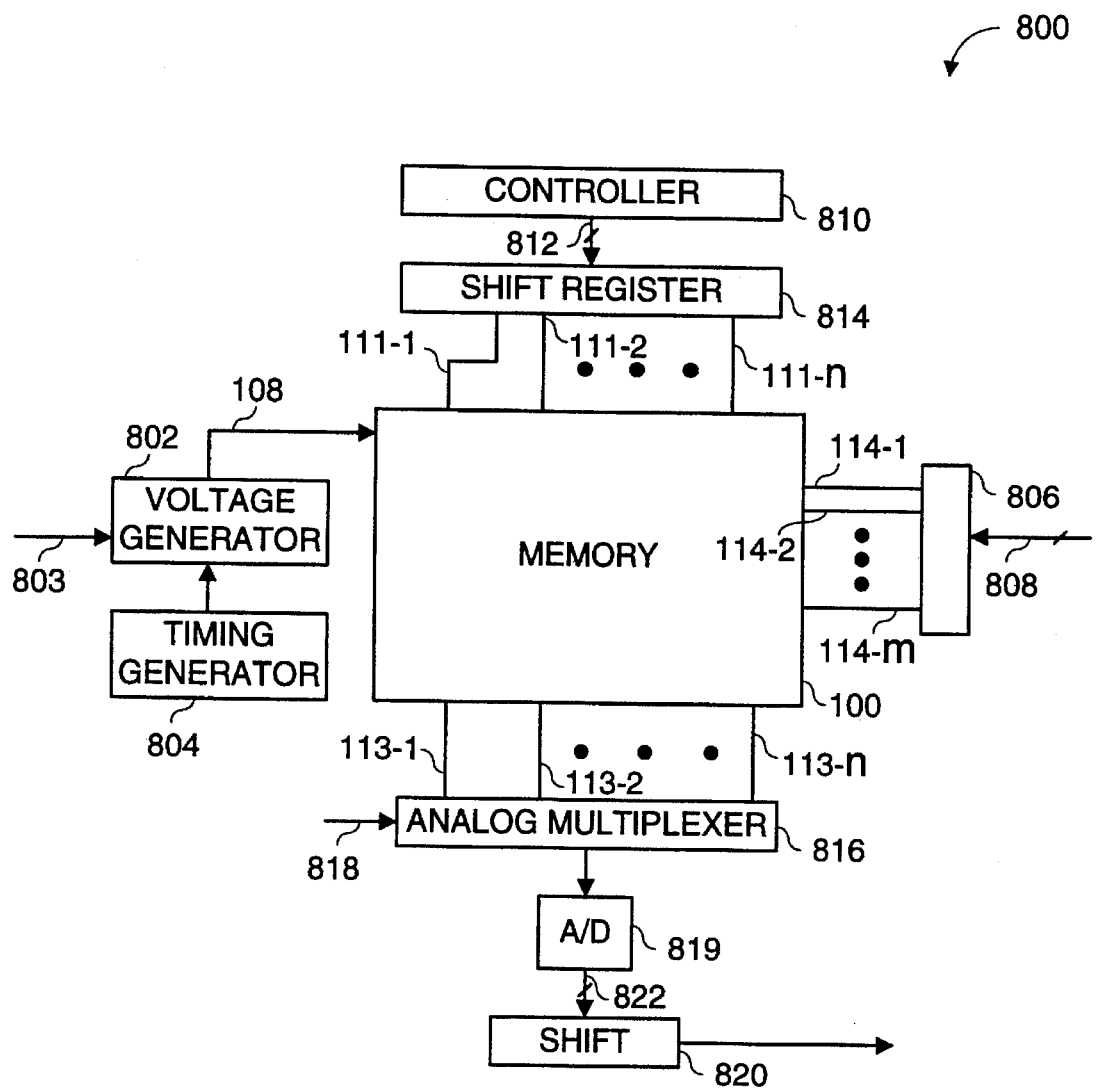
FIG. 8 is a block diagram illustrating a memory system.

Referring to FIG. 8, there is shown a block diagram illustrating a memory system 800. The memory array 100 stores the different voltage levels, as described herein, applied to the signal line 108 by a voltage generator 802 responsive to data signals on a data line 803. A timing generator 804 controls the timing of the voltage generator 802. The voltage generator 802 and the timing generator 804 may operate as described in the U.S. Patent application Ser. No. 08/136,161 filed Oct. 15, 1993, the subject matter of which is incorporated herein by reference. Embodiments of the voltage generator 802 are described later herein in conjunction with FIGS. 9–12.

A decoder 806 selects the word line 114 responsive to address signals applied to an address line 808. A controller 810 provides enabling signals 812 to shift registers 814, which provides enabling signals on lines 111 to the bit drivers in the memory 100. The controller 810 may be, for example, the timing controller described in the U.S. Patent application Ser. No. 08/136,161 filed Oct. 15, 1993, the subject matter of which is incorporated herein by reference.

The memory 100 provides the buffered voltage signal on a line 113 to an analog multiplexer 816. Responsive to control signals 818, the analog multiplexer 816 provides the selected buffered voltage signal to an analog-to-digital converter 818. Because the buffered voltage signal is indicative of a nonuniform multiple logic level signal, the analog-to-digital converter 818 operates nonlinearly, as described later herein in conjunction with FIG. 13. The analog-to-digital converter 818 provides a digital signal to a shift register 820.

Figure 9:
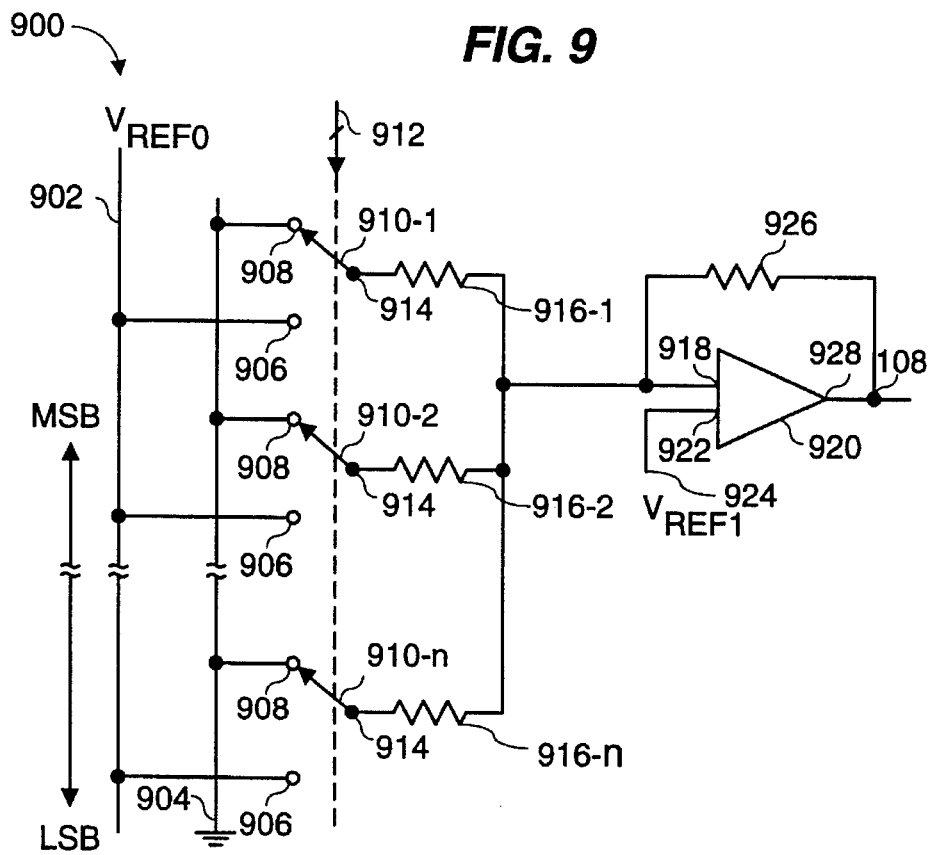
FIG. 9 is a block diagram illustrating a first embodiment of a nonlinear digital-to-analog converter.

Referring to FIG. 9, there is shown a block diagram illustrating a first embodiment of a nonlinear digital-to-analog converter 900 that may be used as the voltage generator 802. The nonlinear digital-to-analog converter 900 has a first voltage reference line 902 and a ground line 904 each coupled to first and second terminals 906 and 908, respectively, of switches 910-1 through 910-n.

Control signals 912 switch the signal applied to the output terminal 914 of the switch 910. A resistor 916-1 through 916-n couples the output terminal 914 of the each respective switch 910-1 through 910-n to a first terminal 918 of an operational amplifier 920. A second terminal 922 of the operational amplifier 920 is coupled to a second voltage reference 924. A resistor 926 couples the first terminal 918 of the operational amplifier 920 to an output terminal 928 of the operational amplifier 920, which is coupled to the signal line 108.

The nonlinear digital-to-analog converter 900 provides a nonuniform logic level, such as an exponential logic voltage dependency. The resistors 916 are selected to be nonlinear. For a higher logic voltage, the resistor has a corresponding higher resistance.

For an integrated circuit implementation, the resistance may be adjusted by changing the shape or thickness of the resistor, or the resistivity of the material.

Figure 10:
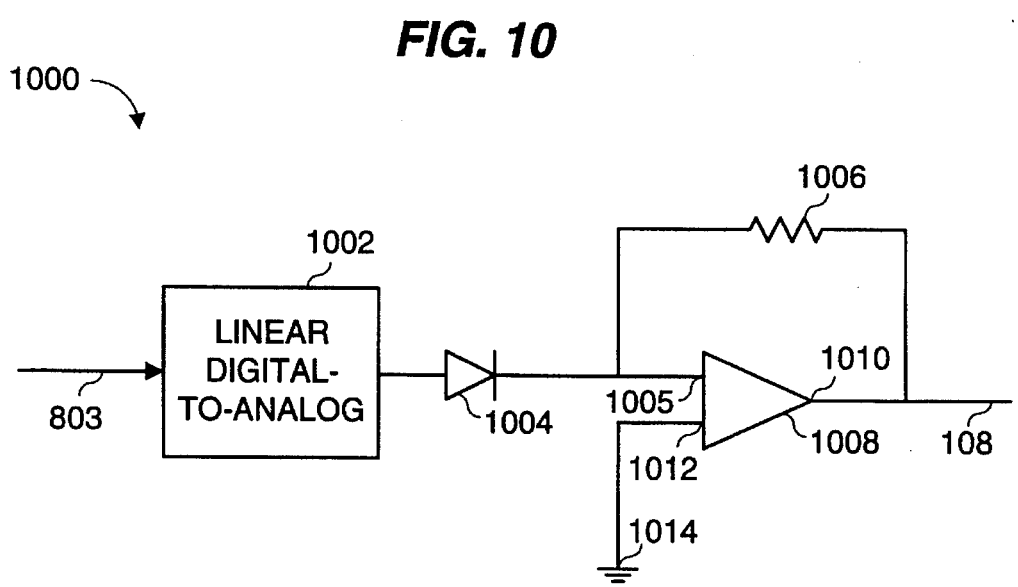
FIG. 10 is a block diagram illustrating a second embodiment of a nonlinear digital-to-analog converter.

Referring to FIG. 10, there is shown block diagram illustrating a second embodiment of a nonlinear digital-to-analog converter 1000 that may be used as a voltage generator 802. The data signals on the data line 803 are applied to a conventional digital-to-analog converter 1002, which converts the data signals into an analog signal having a voltage V.

The analog signal is applied to a diode 1004, which has non linear voltage-current characteristics, to forward bias the diode 1004. The current ($I_D$) through the diode 1004 is given by $$I_D \propto \exp\left(\alpha \frac{V}{T}\right) \quad (10)$$

where V is the forward biasing voltage applied to the diode 1004 and T is the absolute temperature. This provides an exponential voltage dependency. The diode 1004 may be, for example, a p-n junction diode, a Schottky barrier diode, or an MIS diode.

The current from the diode 1004 is applied to a first terminal 1005 of an operational amplifier 1008. A second terminal 1012 of the operational amplifier 1008 is coupled to a reference voltage 1004, such as ground. A resistor 1006 couples the first terminal 1005 to an output terminal 1010 of the operational amplifier 1008, which is coupled to the signal line 108.

Figure 11:
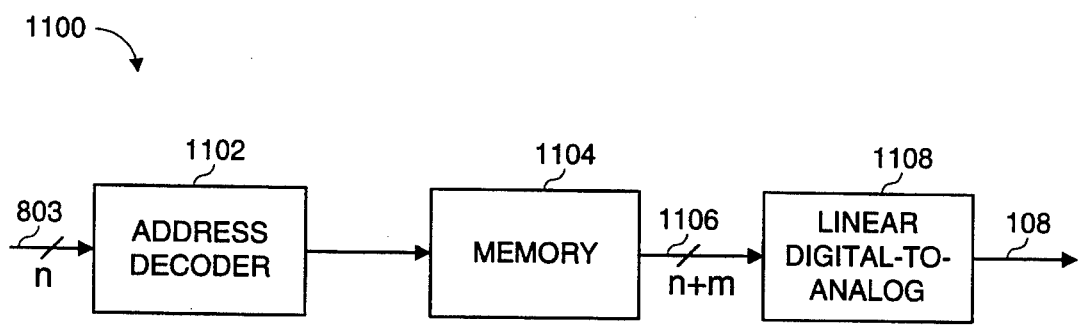
FIG. 11 is a block diagram illustrating a higher order bit digital-to-analog converter.

Referring to FIGS. 11–12, there is shown a block diagram illustrating a higher order bit digital-to-analog converter 1100 and a diagram illustrating the logic level bit conversions therefor. The digital-to-analog converter 1100 may be used for the voltage generator 802. For purposes of illustration, the memory cell 102 is described as an n-bit memory. For an n-bit memory, an additional m-bits are added to the input signal to provide an n+m bit signal to the input of the digital-to-analog converter. The number m is determined using the accuracy of the smallest voltage level.

For example, for 16 logic levels over a 5 volt range with the storage capacitor terminated at the half voltage of 2.5 volts, the voltage difference as described earlier herein is 8.6 times. Three additional bits provide an additional scaling of 8. The n-bit data signal on the line 803 is provided to an address decoder 1102 for addressing a location corresponding to the input signal in a memory 1104 that stores a look up table (see FIG. 12) for converting the data signal into an n+m bit digital reference signal 1106. The memory 1104 may be, for example, a read only memory. The memory 1104 provides the digital reference signal 1106 to a linear digital-to-analog converter 1108 for converting into a drive signal, which is provided to the line 108.

FIG. 12 shows an example of the look up table for a 4 bit multiple logic level memory. The logic levels 1200 are converted to an n bit (here 4 bit) signal 1202 in a manner similar to that shown in FIG. 6. The voltage levels 604 of FIG. 6 are converted into an n+m bit signal 1204 (here 7 bits) in a conventional manner. The 7 bit signal is assigned to the look up table. Three additional bits are added to provide an additional accuracy to the digital-to-analog conversion.

Figure 13:
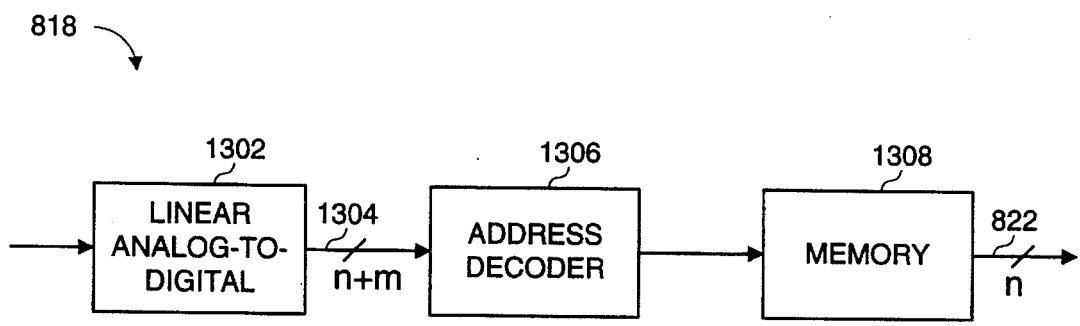
FIG. 13 is a block diagram illustrating a nonuniform analog-to-digital converter of the memory system of FIG. 8.

Referring to FIG. 13, there is shown a block diagram illustrating a nonuniform analog-to-digital converter 818 of the memory system 800. The nonuniform analog-to-digital converter 818 applies an analog signal from the analog multiplexer 816 (FIG. 8) to a linear analog-to-digital converter 1302, which provides an n+m bit signal 1304 to an address decoder 1306. The address decoder 1306 addresses a memory location in a memory 1308 which converts the n+m bit signal 1304 to an n-bit signal 822. Such conversion sues a look up table, such as in FIG. 12. For example, the 7 bits signal 1204 is converted into a 4 bit signal 1202.

In summary, the invention provides a memory having multiple logic levels that are nonuniformly spaced over a voltage range. The voltage levels are selected so that the refresh time of the levels is maximized

I claim:

1. A memory comprising:

a plurality of memory cells, each memory cell having a first input for receiving a selection signal, having a second input for receiving a voltage signal having a voltage level for storage in the memory cell responsive to the selection signal, and having an output for providing an output signal indicative of the voltage signal stored in the memory cell, the voltage level being in a first voltage range divided into a plurality of nonequal second voltage ranges, each nonequal second voltage range being indicative of a different multiple bit digital signal, the voltage level of the voltage signal having a decay that is greater for larger voltages of the voltage signal, and the plurality of nonequal second voltage ranges being selected so that, for each of the second voltage ranges, the decay of the voltage level of the voltage signal in the second voltage range remains in such second voltage range at a predetermined time; and a voltage generator coupled to the second input of the memory cell and having an output for providing the voltage signal responsive to a multiple bit digital data signal.

2. A memory comprising:

a plurality of memory cells, each memory cell having a first input for receiving a selection signal, having a second input for receiving a voltage signal for storage in the memory cell responsive to the selection signal, and having an output for providing an output signal indicative of the voltage signal stored in the memory cell, the voltage signal having a voltage level indicative of a multiple bit digital value, the voltage level being in a first voltage range divided into a plurality of nonequal second voltage ranges, each nonequal second voltage range being indicative of a different multiple bit digital value, each memory cell comprises a capacitor for storing the voltage signal and having a decay that is greater for larger voltages of the voltage signal, and the plurality of nonequal second voltage ranges being selected so that the decay of the voltage level of the voltage signal in the second voltage range remains in the second voltage range for each such voltage range at a predetermined time; and a voltage generator coupled to the second input of the memory cell and having an output for providing the voltage signal responsive to a multiple bit digital data signal.

3. The memory of claim 2 wherein the memory cells each have a decay time in each of the nonequal second voltage ranges that is almost equal.

4. The memory of claim 3, wherein the decay time is a half voltage of full swing.

5. The memory of claim 2, wherein the memory cells further comprises a storage capacitor and a switch device.

6. The memory of claim 5, wherein the switch device is a single switch device including an n-channel FET and a p-channel FET.

7. The memory of claim 6, wherein the switch device is a complement switch.

8. The memory of claim 7 wherein the complement switch includes a p-channel enhancement FET and an n-channel enhancement FET.

9. The memory of claim 1 wherein the voltage generator comprises a digital-to-analog converter having an input for receiving the multiple bit digital data signal and an output for generating the voltage signal and having at least one more bit than the multiple bit digital data signal.

10. The memory of claim 9 wherein the voltage generator further comprises a memory coupled to the digital-to-analog converter for storing a lookup table and for providing another multiple bit data signal to the digital-to-analog converter responsive to the multiple bit digital data signal.

11. The memory of claim 1 wherein the voltage generator comprises a digital-to-analog converter having an input for receiving the multiple bit digital data signal, having an output for generating the voltage signal and having resistors of different resistances to generate the voltage signal nonlinearly relative to the multiple bit digital data signal.

12. The memory of claim 1 wherein the voltage generator comprises a digital-to-analog converter having an input for receiving the multiple bit digital data signal, having an output for generating the voltage signal, and having a nonlinear device to generate the voltage signal nonlinearly relative to the multiple bit digital data signal.

13. The memory of claim 12 wherein the nonlinear device is a diode.

14. The memory of claim 2 wherein the voltage generator comprises a digital-to-analog converter having an input for receiving the multiple bit digital data signal and an output for generating the voltage signal and having at least one more bit than the multiple bit digital data signal.

15. The memory of claim 14 wherein the voltage generator further comprises a memory coupled to the digital-to-analog converter for storing a lookup table and for providing another multiple bit data signal to the digital-to-analog converter responsive to the multiple bit digital data signal.

16. The memory of claim 2 wherein the voltage generator comprises a digital-to-analog converter having an input for receiving the multiple bit digital data signal, having an output for generating the voltage signal and having resistors of different resistances to generate the voltage signal nonlinearly relative to the multiple bit digital data signal.

17. The memory of claim 2 wherein the voltage generator comprises a digital-to-analog converter having an input for receiving the multiple bit digital data signal, having an output for generating the voltage signal, and having a nonlinear device to generate the voltage signal nonlinearly relative to the multiple bit digital data signal.

18. The memory of claim 17 wherein the nonlinear device is a diode.

19. The memory of claim 1 wherein the memory cells each have a delay time in each of the nonequal second voltage ranges that is almost equal.

20. The memory of claim 19, wherein the delay time is a half voltage of full swing.

* * * * *